United States Patent [19]
Tan

[11] Patent Number: 6,091,278
[45] Date of Patent: *Jul. 18, 2000

[54] METHOD AND DEVICE FOR PROCESSING SAMPLED ANALOGUE SIGNALS IN DIGITAL BICMOS PROCESS

[75] Inventor: Nianxiong Tan, Sollentuna, Sweden

[73] Assignee: Telefonaktiebolaget LM Ericsson, Stockholm, Sweden

[*] Notice: This patent issued on a continued prosecution application filed under 37 CFR 1.53(d), and is subject to the twenty year patent term provisions of 35 U.S.C. 154(a)(2).

[21] Appl. No.: 08/876,050

[22] Filed: Jun. 13, 1997

[30] Foreign Application Priority Data

Jun. 14, 1996 [SE] Sweden .................................. 9602362

[51] Int. Cl.[7] ........................ H03K 17/60; H03K 17/687
[52] U.S. Cl. .......................................... 327/432; 327/433
[58] Field of Search .................................. 327/91, 93, 94, 327/433, 259, 391, 427, 432, 434, 437, 478, 489; 326/64, 84, 110

[56] References Cited

U.S. PATENT DOCUMENTS

| | | | |
|---|---|---|---|
| 5,177,377 | 1/1993 | Mathuda et al. ........................ | 326/85 |
| 5,382,842 | 1/1995 | Oguri ..................................... | 326/110 |

FOREIGN PATENT DOCUMENTS 0 372 647A2  6/1990  European Pat. Off. .

OTHER PUBLICATIONS

International Search Report.
Kazunori Tsugaru et al., "A Single–Power–Supply 10–b Video BiCMOS Sample–and–Hold IC", IEEE Journal of Solid–State Circuits, vol. 25, No. 3, Jun. 1990, pp. 653–659.
B. Leung, "BiCMOS Current Cell and Switch for Digital–to–Analog Converters", IEEE Journal of Solid–State Circuits, vol. 28, No. 1, Jan. 1993, pp. 68–71.

Walter Guggenbühl et al., "Switched–Current Memory Circuits for High–Precision Applications", IEEE Journal of Solid–State Circuits, vol. 29, No. 9, Sep. 1994, pp. 1108–1116.

Richard J. Romanczyk et al., "BiCMOS Circuits for High Speed Current Mode D/A Converters", IEEE Journal of Solid–State Circuits, vol. 30, No. 8, Aug. 1995, pp. 923–934.

Peter Shah et al., "A New BiCMOS Technique for Very Fast Discrete–Time Signal Processing", Proceedings of the 1995 International Symposium on Circuits and Systems, 1995, pp. 323–326.

C. Toumazou, et al., "Switched–Currents an Analogue Technique for Digital Technology", Peter Peregrinious Ltd, 1993, pp. 36–39 and 232–235.

*Primary Examiner*—My-Trang Nu Ton
*Attorney, Agent, or Firm*—Burns, Doane, Swecker & Mathis, L.L.P.

[57] ABSTRACT

In a digital BiCMOS process the storage capability of MOS transistors and the large transconductance of bipolar transistors can be utilized in such a way, that the speed is primarily determined by the capacitance seen by the MOS transistor (4) and the transconductance of the bipolar transistor (5). The advantages over the prior SI technique in CMOS are higher speed, smaller errors and higher accuracy. The advantages over other techniques in BiCMOS are smaller errors and higher accuracy. The unique feature of the invented technique is the combination of high input impedance of the MOS devices and high transconductance of the bipolar devices, where both devices are only available in BiCMOS process and not in the CMOS process.

4 Claims, 2 Drawing Sheets

METHOD AND DEVICE FOR PROCESSING SAMPLED ANALOGUE SIGNALS IN DIGITAL BICMOS PROCESS

FIELD OF THE INVENTION

The present invention relates to a method for processing sampled analogue signals in a digital BiCMOS process and a device for processing sampled analogue signals in a digital BiCMOS process.

BACKGROUND OF THE INVENTION

The switched current (SI) technique is a relatively new analog sampled data signal processing technique, that fully exploits digital CMOS technology, see for example "Switched currents, an analogue technique in digital technology" by C. Toumazou, J. B. Hughes and N. C. Battersby, Peter Peregrinius Ltd, 1993. The ultimate performance of the SI circuits is primarily determined by the transconductance $g_m$ of an MOS transistor and the capacitance Cg seen by its gate. Although a high speed operation (around 100 Mhz) is possible, the performance of speed and accuracy is limited by the technique itself. In order to have high accuracy, large Cg is usually required, since the clock feedthrough error is inversely proportional to Cg. Therefore, increasing $g_m$ is the only way to increase the speed. With the same bias current, the transconductance of an MOS transistor is considerably lower than that of a bipolar transistor. Therefore, utilization of the bipolar transistor could increase the speed and/or improve the accuracy. BiCMOS technology opens the possibility of using both MOS and bipolar transistors.

A technique has been proposed for a high speed sampled-data signal processing in BiCMOS, see for example "A new BiCMOS technique for very fast discrete time signal processing" by P. Shak and C. Toumazou in Proc. 1995 International Symposium on Circuits and Systems pp. 323–326. It breaks the limitation of $g_m$/Cg of the SI circuits by utilizing bipolar transistors. It first converts a current to a voltage by a transresistor and then converts the voltage to a current by a transconductor. The voltage is sampled and held at the input of the transconductor, whose input device is an MOS transistor. However, the conversion accuracy is determined by the absolute value of the components. For example, the resistor determines the transresistance value, and the transistor size and the operation condition determine the transconductance value. Therefore the technique is sensitive to process variation and another drawback is its complexity.

Patent applications have been filed by John B. Hughes of Philips, U.K. on a technique, which was referred to as the switched-current technique, see for example EP 89203067.7, Apr. 12, 1989. All these applications were concentrated on the technique for a digital CMOS process.

SUMMARY OF THE INVENTION

In a digital BiCMOS process the storage capability of MOS transistors and the large transconductance of bipolar transistors can be utilized in such a way, that the speed is primarily determined by the capacitance seen by the MOS transistor and the transconductance of the bipolar transistor. The advantages over the prior SI technique in CMOS are higher speed, smaller errors, and higher accuracy. The advantages over other techniques in BiCMOS such as mentioned in the background of the invention are smaller errors and higher accuracy. The unique feature of the invented technique is the combination of high input impedance of the MOS devices and high transconductance of the bipolar devices, where both devices are only available in BiCMOS process and not in the CMOS process.

DETAILED DESCRIPTION OF THE PREFERRED EMBODIMENTS

Figure 1:
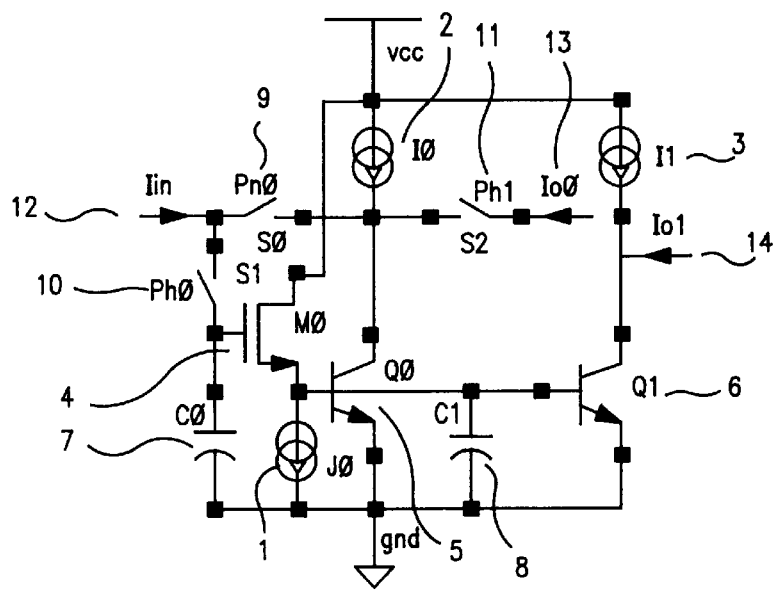
FIG. 1 is a circuit configuration of the proposed technique according to the invention.

The proposed new technique utilizes a composite transistor consisting of an MOS transistor and a bipolar transistor. The MOS transistor is in common-drain configuration and the bipolar transistors are in common-emitter configuration as shown in FIG. 1. Current sources J0 1, I0 2 and I1 3 provide bias currents for transistors M0 4, Q0 5 and Q1 6, respectively. A capacitor C0 7 represents all the capacitance at the gate of the transistor M0 and C1 8 represents all the capacitance at the source of the transistor M0.

All the switches are controlled by a non-overlapping clock. During clock phase Ph0, switches S0 9 and S1 10 are closed, and S2 11 is open. The input current Iin 12 flows into the collector of the transistor Q0 and makes the base-emitter voltage change correspondingly. Due to the common-drain configuration of the transistor M0, its gate source voltage does not change, the potential at the gate of the transistor M0 changes proportionally as well. When the stable condition is reached, a potential at the gate of the transistor M0 is created to change the base-emitter voltage of the transistor Q0 to sink (or source) the input current into the transistor Q0. Since the transistors Q0 and Q1 have the same base-emitter voltage, the output current Io1 14 is equal to the input current Iin, if the two transistors have the same emitter area.

During clock phase Ph1, the switches S0 and S1 are open and S2 is closed. The gate of the MOS transistor M0 is isolated and the potential at the gate is held. Since the gate source voltage of the transistor M0 is constant, the base-emitter voltage of the transistor Q0 does not change. Therefore, the collector current of the Q0 does not change. The output current Io0 13 is equal to the input current Iin, that was the input into the transistor Q0 during the clock phase Ph0. Since the transistors Q0 and Q1 have the same base-emitter voltage, the output current Io1 is equal to the output current Io0, if the two transistors have the same emitter area.

Therefore, the output current Io0 is the memory of the input current Iin and the output current Io1 realizes the track-and-hold function performed on the input current Iin. Since same devices as M0 and Q0 are used both as input and as output devices, there is no mismatch between input current Iin and the output current Io0, just as in a second-generation SI memory cell. A scaling factor between the output current Io1 and the input current Iin can be realized by choosing a different emitter area.

The speed of the circuit is determined by the settling time when the switches S0 and S1 are closed. Neglecting the switch-on resistance of the switch transistors, the system is a two-pole system. The dominant pole frequency $\omega_o$ is equal to $g_{mQ0}/C0$, where $g_{mQ0}$ is the transconductance of the bipolar transistor Q0 and C0 is the total capacitance at the gate of M0. The non-dominant pole frequency $\omega_n$ is equal to $g_{mM0}/C1$, where $g_{mM0}$ is the transconductance of the MOS transistor M0 and C1 is the total capacitance at the source of the transistor M0.

For SI circuits in the CMOS process, the dominant pole frequency is determined by the total capacitance seen by the gate of the MOS transistor and the transconductance of the MOS transistor. Due to the higher transconductance of bipolar transistor, the proposed technique has a superior speed performance if the non-dominant frequency is sufficiently high. This can be satisfied in circuit design by minimizing the capacitance at the source of M0, especially when a reasonably large capacitance C0 is used to reduce clock feedthrough errors.

Speed could also be traded off for accuracy by using a large capacitance C0, since the clock feedthrough error is inversely proportional to the C0. Also due to the use of the bipolar transistor, the voltage change at the gate of the M0 is small even with large input currents, which reduces the signal dependent clock feedthrough errors. Another source of errors in the SI circuits in the CMOS process is due to the drain-gate parasitic capacitance. When the drain potential changes, it couples into the gate through the drain-gate parasitic capacitance, which introduces excessive errors, especially for high frequency applications. In the proposed circuit shown in FIG. 1, the drain potential of the MOS transistor is tied to Vcc and, therefore, during switching the gate voltage is not influenced. Therefore, the proposed technique has much smaller errors, both signal dependent and signal independent errors.

The devices M0 and Q0 are used both as input and as output devices as in second-generation SI memory cells in the CMOS process, mismatch does not introduce any error. However, in most cases current mirrors are needed to realize different coefficients as in the case of using transistor Q1 and mismatch plays an important role. Since the bipolar transistor matching is better than the MOS transistor matching, the proposed technique is also superior to the SI technique in CMOS process concerning accuracy.

Finally, it is worthwhile to note the simplicity. Since bipolar transistors have larger early voltages and the potential change at the collector of the Q0 is small during the input and output stages, the circuit illustrated in FIG. 1 can function well without further elaboration. In principle, the SI circuits are simple in the CMOS process too. However, to deal with different errors, e.g. clock feedthrough errors, limited input/output conductance ratio errors, the errors due to the gate-drain parasitic capacitance, relatively complex circuits and/or clocking are needed. The proposed technique does not require linear capacitors as the SI technique in the CMOS process. Compared with the technique earlier proposed, the new technique does not demand matching between a transresistor and transconductor and the circuit scheme is much simpler.

Figure 2:
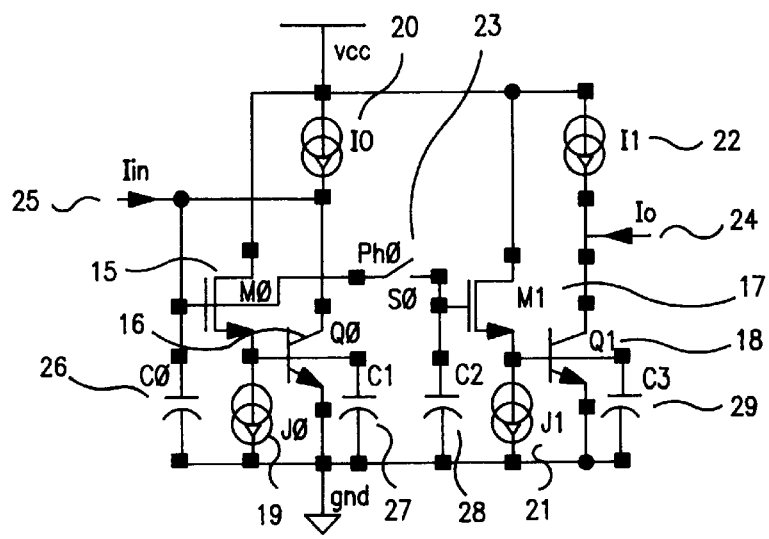
FIG. 2 is an alternative circuit configuration of the proposed technique according to the invention.

An alternative circuit realization is shown in FIG. 2. It bears resemblance to the first-generation SI memory cell in the CMOS process. In FIG. 2 different devices are used for input and output. The transistors M0 15 and Q0 16 are used as input devices, and the transistors M1 17 and Q1 18 are used as output devices. Current sources J0 19, I0 20, J1 21 and I1 22 provide bias currents for transistors M0, Q0, M1 and Q1, respectively.

The capacitor C0 26 represents all the capacitance at the gate of transistor M0. The capacitor C1 27 represents all the capacitance at the source of transistor M0. The capacitor C2 28 represents all the capacitance at the gate of transistor M1. The capacitor C3 29 represents all the capacitance at the source of transistor M1.

Suppose the transistors M0 and M1 have the same size and the transistors Q0 and Q1 have the same size. During the clock phase Ph0 when the switch S0 23 is closed, the gate voltage of the M1 is equal to that of the M0 and therefore the base emitter voltages of the transistors Q0 and Q1 equal. This makes the collector currents of the Q0 and Q1 equal. Therefore the output current Io 24 is equal to the input current Iin 25. During the clock phase Ph1 when switch the S0 is open, the gate of M1 is isolated and the potential is held. This makes the base-emitter voltage of the Q1 constant and therefore the collector current is constant. The output current Io is held constant. Therefore, the circuit realizes a track-and-hold function just as the first-generation SI memory cell in CMOS process. This circuit shows superior performance over its CMOS counterparts just as outlined above.

Figure 3:
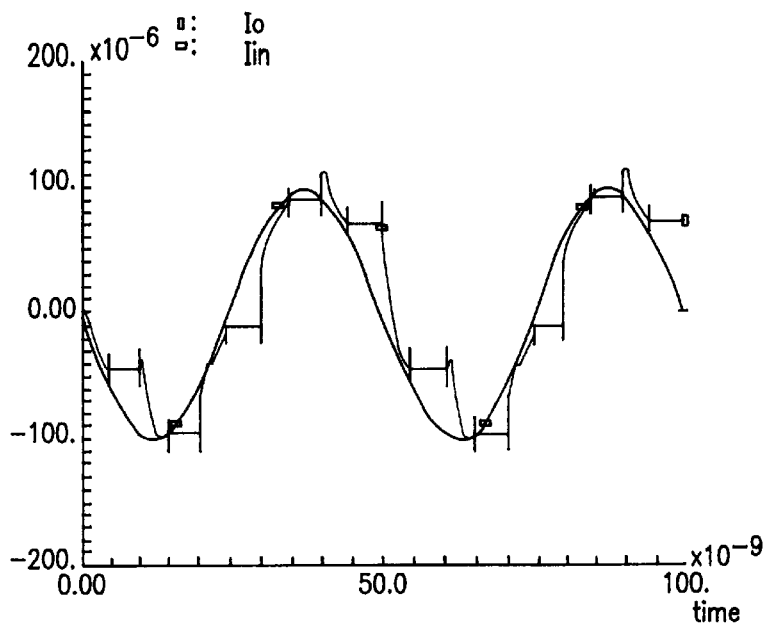
FIG. 3 shows a simulated response of the circuit of FIG. 1.

In order to verify the functionality, the circuit shown in FIG. 1 is simulated by using parameters of a 3.3-V digital BiCMOS process. The supply voltage is 3.3 V. The input current Iin and output current Io1 are shown in FIG. 3. The input current is a 20-MHz 100-uA sinusoidal and the clock frequency is 100 MHZ. It is evident that a track-and-hold function is realized.

Figure 4:
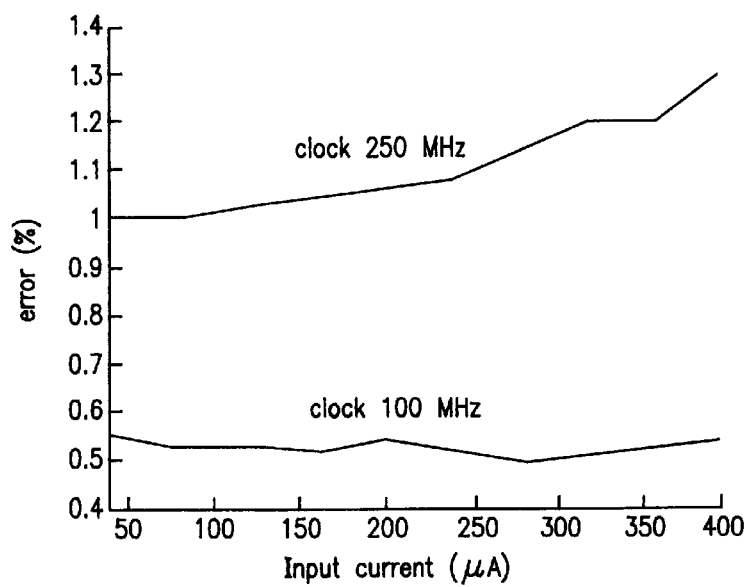
FIG. 4 shows simulated errors versus input currents according to the invention.

In FIG. 4 the simulated current errors are shown versus input currents of a fully differential design based on the circuit scheme shown in FIG. 1. The bias current in each branch is about 360 uA. It is seen that when the sampling frequency is 100 Mhz, the error is less 0.55% and the variation is small. This indicates good linearity. When the clock frequency increases to 250 MHz, the error increases due to the settling error. The error variation is still small when the input current is less than 50% of the bias current, indicating good linearity.

While the foregoing description includes numerous details and specificities, it is to be understood that these are merely illustrative of the present invention, and are not to be construed as limitations. Many modifications will be readily apparent to those skilled in the art which do not depart from the spirit and scope of the invention, as defined by the appended claims and their legal equivalents.

I claim:

1. A device for processing sampled analog current signals in a digital BiCMOS process using a plurality of NMOS transistors and a plurality of NPN bipolar transistors in the BiCMOS process, comprising:

means for generating a voltage corresponding to an input current and temporarily storing the voltage at a gate of a first one of the plurality of NMOS transistors;

means for boosting a speed of the device while a transconductance of at least one of the plurality of NPN bipolar transistors is used, wherein;

the first one of the plurality of NMOS transistors is provided in a common-drain configuration and a first one of the plurality of NPN bipolar transistors is provided in a common-emitter configuration, and both are used and connected as an input device;

a second one of the plurality of NMOS transistors is provided in a common-drain configuration and a second one of the plurality of NPN bipolar transistors is provided in a common-emitter configuration, and both are used and connected as an output device;

and the input and output devices are connected together only on one clock phase controlled by a non-overlapping clock.

2. A method for processing sampled analog current signals in a digital BiCMOS process using a plurality of NMOS transistors and a plurality of NPN bipolar transistors in the BiCMOS process, comprising the steps of:

generating a voltage corresponding to an input current and temporarily storing the voltage at a gate of a first one of the plurality of NMOS transistors; and boosting a speed of the signal processing while a transconductance of at least one of the plurality of NPN bipolar transistors is used, by connecting an input device and an output device together only on one clock phase controlled by a non-overlapping clock, wherein;

the first one of the plurality of NMOS transistors is provided in a common-drain configuration and a first one of the plurality of NPN bipolar transistors is provided in a common-emitter configuration, and both are used and connected as the input device; and a second one of the plurality of NMOS transistors is provided in a common-drain configuration and a second one of the plurality of NPN bipolar transistors is provided in a common-emitter configuration, and both are used and connected as the output device.

3. A device for processing sampled analog current signals in a digital BiCMOS process using at least one NMOS transistor and a plurality of NPN bipolar transistors in the BiCMOS process, comprising:

means for generating a voltage corresponding to an input current and temporarily storing the voltage at a gate of a first one of the at least one NMOS transistor;

means for boosting a speed of the device while a transconductance of at least one of the plurality of NPN bipolar transistors is used, wherein;

the first one of the at least one NMOS transistor is provided in common-drain configuration and a first one of the plurality of NPN bipolar transistors is provided in a common-emitter configuration, and both are used and connected as input and output devices on different clock phases controlled by a non-overlapping clock, wherein a gate of the first one of the at least one NMOS transistor is connected to a collector of the first one of the plurality of NPN bipolar transistors only on one clock phase controlled by the non-overlapping clock, and a second one of the plurality of NPN bipolar transistors is used and connected to realize a current track-and-hold function with a scaling factor determined by emitter areas of the first and second ones of the plurality of NPN bipolar transistors.

4. A method for processing sampled analog signals in a digital BiCMOS process using at least one NMOS transistor and a plurality of NPN bipolar transistors in the BiCMOS process, comprising the steps of:

generating a voltage corresponding to an imput current and temporarily storing the voltage at a gate of a first one of the at least one NMOS transistor;

boosting a speed of the signal processing while a transconductance of at least one of the plurality of NPN bipolar transistors is used, by connecting a gate of the first one of the at least one NMOS transistor to a collector of a first one of the plurality of NPN bipolar transistors only on one clock phase controlled by a non-overlapping clock, wherein the first one of the at least one NMOS transistor is provided in a common-drain configuration and a first one of the plurality of NPN bipolar transistors is provided in a common-emitter configuration, and both are used and connected as the input and output devices; and realizing a current track-and-hold function using a second one of the plurality of NPN bipolar transistors, wherein a scaling factor is determined by emitter areas of the first and second ones of the plurality of NPN bipolar transistors.

* * * * *